United States Patent [19]

Gokita

[11] Patent Number: 4,777,554
[45] Date of Patent: Oct. 11, 1988

[54] METHOD AND APPARATUS FOR DETECTING CHARGER ABNORMALITY

[75] Inventor: Masami Gokita, Tokyo, Japan

[73] Assignee: Tokyo Shibaura Denki Kabushiki Kaisha, Kawasaki, Japan

[21] Appl. No.: 921,806

[22] Filed: Oct. 20, 1986

Related U.S. Application Data

[63] Continuation of Ser. No. 541,913, Oct. 14, 1983, abandoned.

[30] Foreign Application Priority Data

Oct. 18, 1982 [JP] Japan .................................. 57-182519

[51] Int. Cl.⁴ .............................................. H02H 3/20
[52] U.S. Cl. ........................................ 361/91; 361/86; 361/87; 361/93; 355/3 CH; 355/14 CH; 364/483
[58] Field of Search ................. 361/91, 92, 93, 235, 361/78, 86, 87, 88; 307/130, 131; 355/3 CH, 14 CH; 364/483; 340/657, 660

[56] References Cited

U.S. PATENT DOCUMENTS

| | | | |
|---|---|---|---|
| 2,775,752 | 12/1956 | Hoberman | 340/660 |
| 3,940,679 | 2/1976 | Brandwein et al. | 340/660 |
| 4,075,677 | 2/1978 | Bentley | 364/235 |
| 4,133,477 | 1/1979 | Marino et al. | 371/20 |
| 4,286,862 | 9/1981 | Akita et al. | 361/235 |
| 4,346,986 | 8/1982 | Kuge et al. | 355/14 CH |
| 4,355,885 | 10/1982 | Nagashima | 361/235 |
| 4,417,804 | 11/1983 | Werner, Jr. | 355/3 CH |
| 4,510,443 | 4/1985 | Inaba et al. | 355/3 CH |

FOREIGN PATENT DOCUMENTS

| | | |
|---|---|---|
| 2213419 | 10/1973 | Fed. Rep. of Germany . |
| 2359532 | 7/1974 | Fed. Rep. of Germany . |
| 2611503 | 11/1976 | Fed. Rep. of Germany . |

*Primary Examiner*—A. D. Pellinen
*Assistant Examiner*—Jeffrey A. Gaffin
*Attorney, Agent, or Firm*—Cushman, Darby & Cushman

[57] ABSTRACT

A charger abnormality detecting device and method uses a current detector for detecting a current flowing between a photoconductive drum and a charger arranged near the drum, a current detector for detecting a current flowing through the charger, and a voltage detector for detecting a high voltage applied to the charger. The type of abnormality of the charger is discriminated in accordance with currents and a voltage detected by the current detectors and the voltage detector, respectively.

9 Claims, 5 Drawing Sheets

FIG. 6

METHOD AND APPARATUS FOR DETECTING CHARGER ABNORMALITY

This is a continuation of application Ser. No. 541,913 filed Oct. 14, 1983, which was abandoned upon the filing hereof.

BACKGROUND OF THE INVENTION

The present invention relates to a charger abnormality detecting device, which detects abnormalities such as a defect in a high voltage source, charge wire contamination, or charge wire disconnection in an electrophotographic apparatus or the like.

In a charger for charging or removing charge from a photoconductive drum in an electrophotographic apparatus or the like, when a high voltage source is defective, high voltage measurement instruments such as a high voltage voltmeter or a synchroscope are required to detect a defective part. Maintenance personnel usually do not have such instruments on hand. Thus, when such a defect is plausible, maintenance personnel must visually observe the copied image and determine if the power source is defective, relying on experience. No measuring instrument for detecting charge wire contamination or disconnection of a charger is heretofore available. For this reason, after a predetermined number of copies (e.g., 5,000 to 10,000 copies) have been produced, the charger is cleaned or replaced with a new one irrespective of its state of contamination or disconnection. This has resulted in time-consuming and high-cost maintenance servicing.

SUMMARY OF THE INVENTION

It is an object of the present invention to provide a method and apparatus for detecting charger abnormality. The present invention comprises the steps of and components for detecting and signaling a defective high voltage source, charge wire contamination, charge wire disconnection or the like with high precision.

According to an aspect of the present invention, a charger abnormality detecting device and method comprises a voltage detector for detecting an output voltage from a high voltage source; a first current detector for detecting a current flowing between a charger and a member to be charged, e.g., a photoconductive member; a second current detector detecting a current flowing through the charger; and a disciminator for discriminating an abnormality of the charger from a correlation of detection outputs from said voltage detector and said first and second current detectors.

DETAILED DESCRIPTION OF THE PREFERRED EMBODIMENTS

Figure 1:
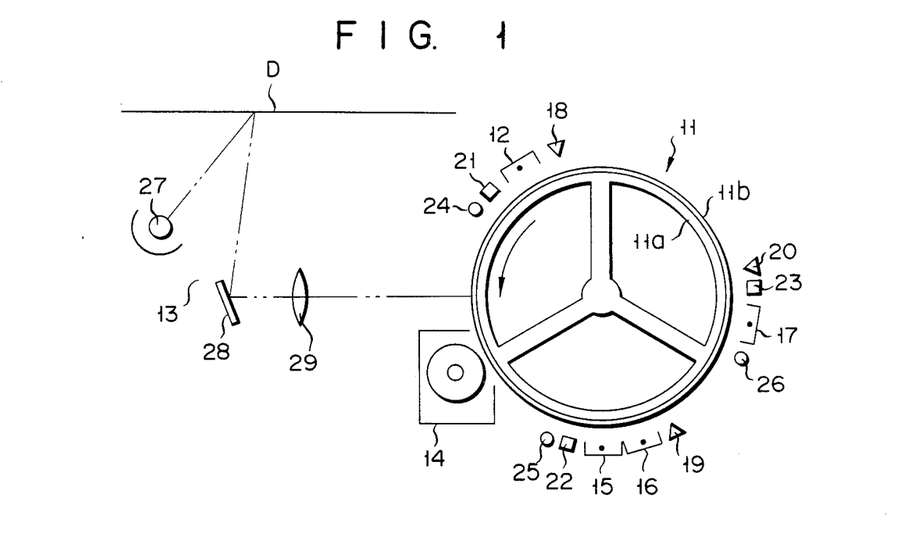
FIG. 1 is a schematic representation of an electrophotographic apparatus having a charger abnormality detecting device according to an embodiment of the present invention.

An electrophotographic apparatus schematically shown in FIG. 1 has a photoconductive drum 11 comprising a drum body 11a and a photoconductive layer 11b formed around the outer surface of the drum body 11a. A first charger 12, an exposure unit 13, a developer 14, a second charger 15, a third charger 16 and a fourth charger 17 are arranged around the drum 11 in the order named along the direction of rotation of the drum 11. The first charger 12 serves to charge the entire surface of the photoconductive drum 11. The second charger 15 serves as a transfer charger for transferring a toner image onto paper. The third charger 16 is a paper separating charger for peeling off the paper to which the image has been transferred from the surface of the photoconductive drum 11. The fourth charger 17 removes any charge remaining on the surface of the photoconductive drum 11 as a pretreatment prior to cleaning of the surface of the photoconductive drum 11.

Thermal sensors 18, 19 and 20, hygro sensors 21, 22 and 23, and barometric sensors 24, 25 and 26 are arranged in the vicinities of the first charger 12, the second and third chargers 15 and 16, and the fourth charger 17.

An optical scanning system 13 for optically scanning a document D includes a light source 27 for directing light toward document D, a mirror 28 for directing reflected light from the document D toward the photoconductive drum 11, and a lens 29 for focusing the light from the mirror 28 onto the surface of the photoconductive drum 11.

Figure 2:
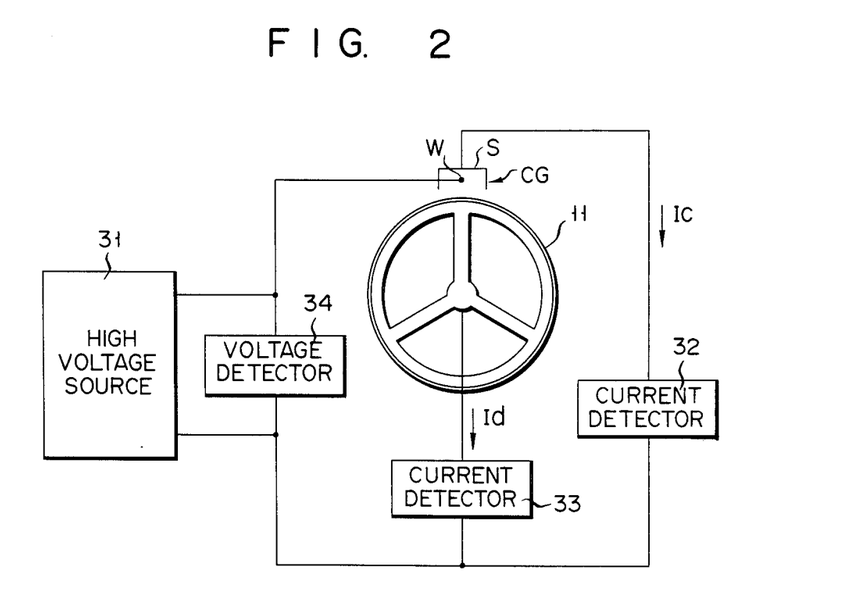
FIG. 2 is a block diagram of the charger abnormality detecting device in FIG. 1.

FIG. 2 shows the circuitry for detecting information components for the respective chargers 12, 15, 16 and 17. In FIG. 2, each of the chargers 12, 15, 16 and 17 is indicated as CG. A charge wire W of the charger CG is connected to one terminal of a high voltage source 31 (corresponding to each of the high voltage sources $31_1$ to $31_4$). A shield case S is connected to the other terminal of the high voltage source 31 through a current detector 32. The photoconductive drum 11 is connected to the other terminal of the high voltage source 31 through a current detector 33. A voltage detector 34 is connected between the two terminals of the high voltage source 31.

Figure 3:
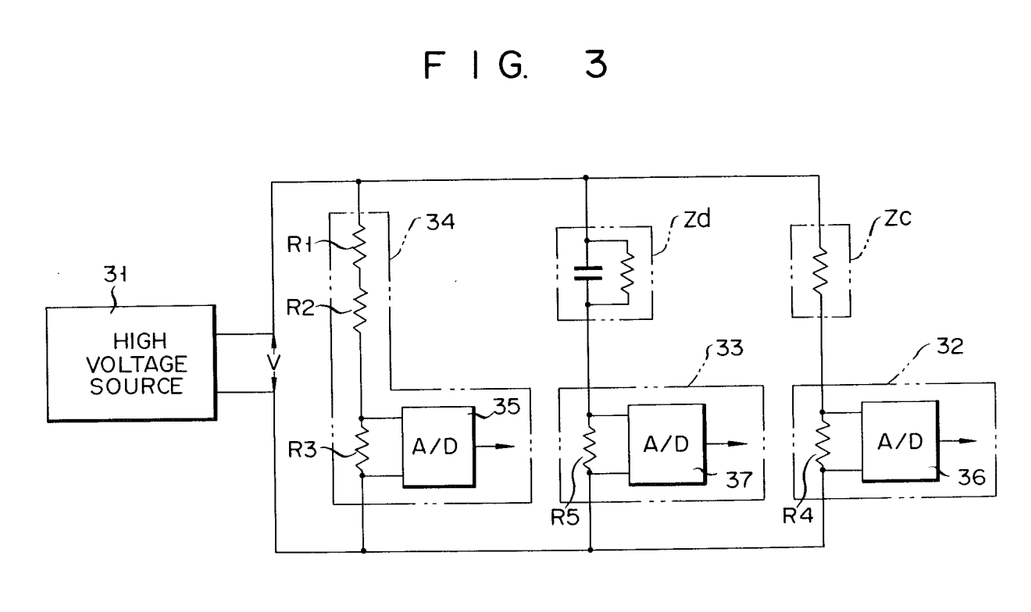
FIG. 3 is an equivalent circuit diagram of the device shown in FIG. 2.

FIG. 3 shows an equivalent circuit diagram of the circuitry shown in FIG. 2. According to this equivalent circuit diagram, the voltage detector 34 comprises dividing resistors R1, R2 and R3 and an A/D converter 35 connected between the terminals of the resistor R3. The current detector 32 comprises a current detecting resistor R4 and an A/D converter 36, and is connected to the high voltage source 31 through an impedance Zc consisting of only a resistor formed between the shield case S and a charge wire W. The current detector 33 comprises a current detecting resistor R5 and an A/D converter 37 and is connected to the high voltage source 31 through an impedance Zd. The impedance Zd comprises a parallel circuit of a resistor and a capacitor, which is formed between the charge wire W and the drum body 11a of the photoconductive drum 11.

Figure 4:
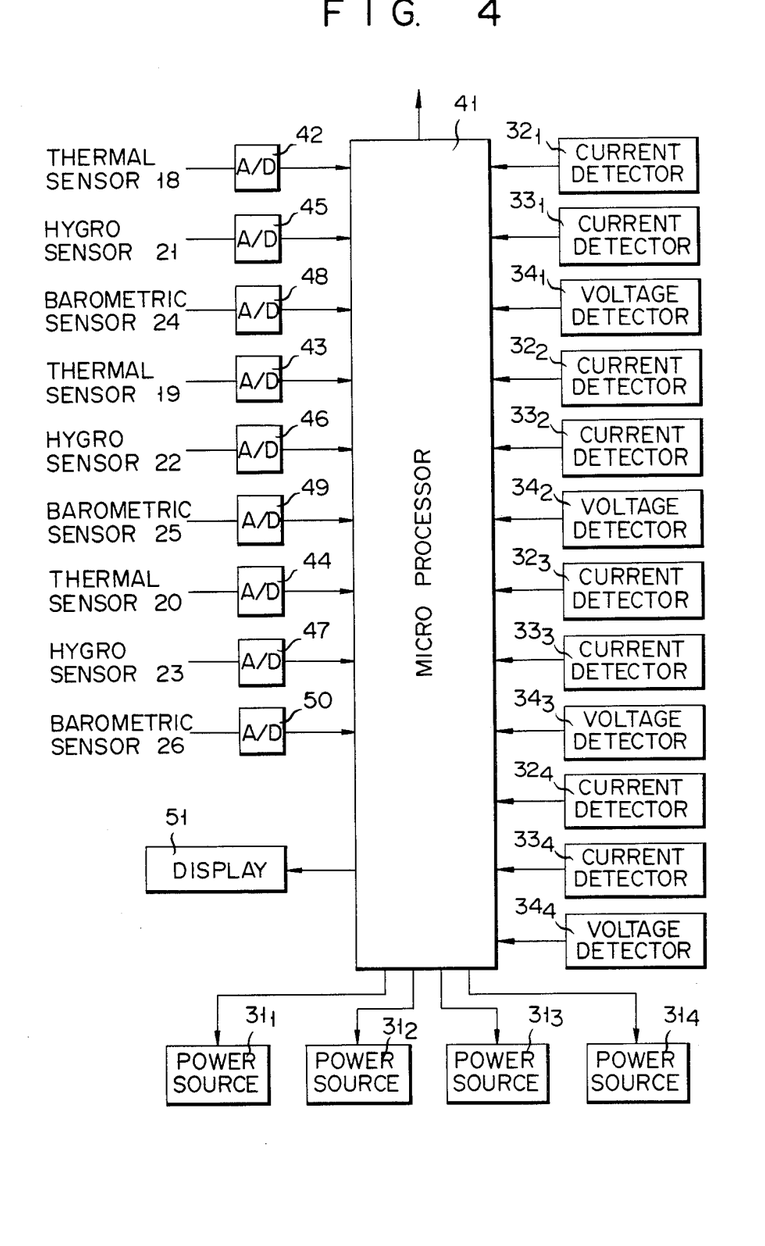
FIG. 4 is a block diagram of a main control section of the charger abnormality detecting device of the present invention.

FIG. 4 shows a control section for discriminating an abnormality. The control section mainly comprises a microprocessor 41. The thermal sensors 18, 19 and 20, the hygro sensors 21, 22 and 23, and the barometric sensors 24, 25 and 26 are connected to the microprocessor 41 through A/D converters 42 to 50, respectively.

Current detectors $32_1$ to $32_4$ and $33_1$ to $33_4$ and voltage detectors $34_1$ to $34_4$ are also connected to the microprocessor 41. The current detectors $32_1$ and $33_1$ and the voltage detector $34_1$ are connected to the first charger 12. Similarly, the current detectors $32_2$ to $32_4$ and $33_2$ to $33_4$ and the voltage detectors $34_2$ to $34_4$ are connected to the second to fourth chargers 15, 16 and 17, respectively, as in the circuitry shown in FIG. 2. The output terminals of the microprocessor 41 are connected to the high voltage sources $31_1$ to $31_4$ in order to control them. The microprocessor 41 is also connected to a display panel 51. The display panel 51 is arranged at the operation panel of the cabinet of the electrophotographic apparatus so as to display various types of abnormalities.

The impedance Zd between the charge wire W and the photoconductive drum 11 and the equivalent impedance Zc between the charge wire W and the case S change in accordance with ambient temperature, humidity and atmospheric pressure. The extent of such changes in impedance depends on the structure surrounding the photoconductive drum 11 and can be experimentally determined. Accordingly, the experimentally determined values of changes in these impedances are set in the microprocessor 41, and the outputs from the high voltage sources $31_1$ to $31_4$ are controlled to cancel the changes in impedance in accordance with the signals from the respective sensors (thermal sensor, etc). When such control is adopted, the signals obtained from the current detectors $32_1$ to $32_4$ and $33_1$ to $33_4$ become substantially constant. In this embodiment, the changes in impedance which are caused by changes in ambient temperature, humidity and atmospheric pressure are corrected. Even when the ambient temperature, humidity and atmospheric pressure change maximally under the operating conditions of the electrophotographic apparatus, changes in these impedances remain below a maximum of 10% of the original values. Accordingly, such changes do not substantially affect the detection precision of abnormalities of the high voltage sources and chargers. For this reason, correction of impedance in accordance with changes in the ambient temperature, humidity and atmospheric pressure need not always be performed.

In this manner, although output voltages V from the high voltage sources $31_1$ to $31_4$ change in accordance with impedance correction due to changes in ambient temperature, humidity and atmospheric pressure, such changes in the output voltages V are small. Thus, the signals obtained from the voltage detectors $34_1$ to $34_4$ are considered to be substantially constant in the normal state. Based on this assumption, according to the present invention, abnormalities in the high voltage sources and chargers are detected in accordance with fluctuations in the output voltage V from each high voltage source, a current Id flowing between the charge wire W and the photoconductive drum 11, and a current Ic flowing between the charge wire W and the shield case S. When the output voltage V from the high voltage source is an AC voltage, currents Id and Ic proportional to the output voltage V flow between the charge wire W and the photoconductive drum 11 and between the charge wire W and the shield case S. On the other hand, if the output voltage V from the high voltage source is a DC voltage, only a current Ic proportional to the output voltage V flows between the charge wire W and the shield case S. In this case, since charge is accumulated between the charge wire W and the photoconductive drum 11, a current proportional to the difference between the output voltage V and the surface potential of the photoconductive drum 11 flows between the charge wire W and the photoconductive drum 11. However, the currents flowing through the current detectors $33_1$ to $33_4$ are leakage currents from the photoconductive drum 11 and are not proportional to the output voltage V. Furthermore, since these currents are not constant in the normal state, they cannot be used for detection of an abnormality. Accordingly, if the output voltage V is an AC voltage, abnormality detection is performed using only the output voltage V and the current Ic. Table 1 below shows the criteria for discriminating the occurrence of abnormalities, which criteria correspond to those for a case wherein the output voltage V is an AC voltage. The impedance Zd in Table 1 is obtained by calculation in the microprocessor 41 using the output voltage V and the current Id. Similarly, the impedance Zc is calculated from the output voltage V and the current Ic.

TABLE 1

| Impedance | | Current | | Voltage | Abnormality | Type of |
| --- | --- | --- | --- | --- | --- | --- |
| Zd | Zc | Id | Ic | V | signal | abnormality |
| 100% | 150% or more | — | — | — | 0001 | Case contamination |
| 150% or more | 150% or more | — | — | — | 0010 | Wire contamination |
| ∞ | ∞ | 0% | 0% | — | 0011 | Wire disconnection |
| 100% | 50% or less | — | — | — | 0100 | Charge leak |
| 100% | 100% | 50% or less 150% or more | 50% or less 150% or more | 50% or less 150% or more | 0101 source | Defective high voltage |

When the shield case S of one of the chargers 12, 15, 16 and 17 is contaminated, the impedance Zc of the corresponding charger increases but the impedance Zd remains unchanged. When Zd=100% and Zc≧150% (when the impedance Zc in the normal state is 100%), the microprocessor 41 determines that the shield case S has become contaminated. Then, the microprocessor 41 supplies an abnormality signal "0001" to the display panel 51 to display the occurrence of the abnormality and the type thereof. The condition Zc≧150% is set in consideration of the fact that the impedance Zc changed by about ±10% in the normal state depending on other environmental factors.

Figure 5:
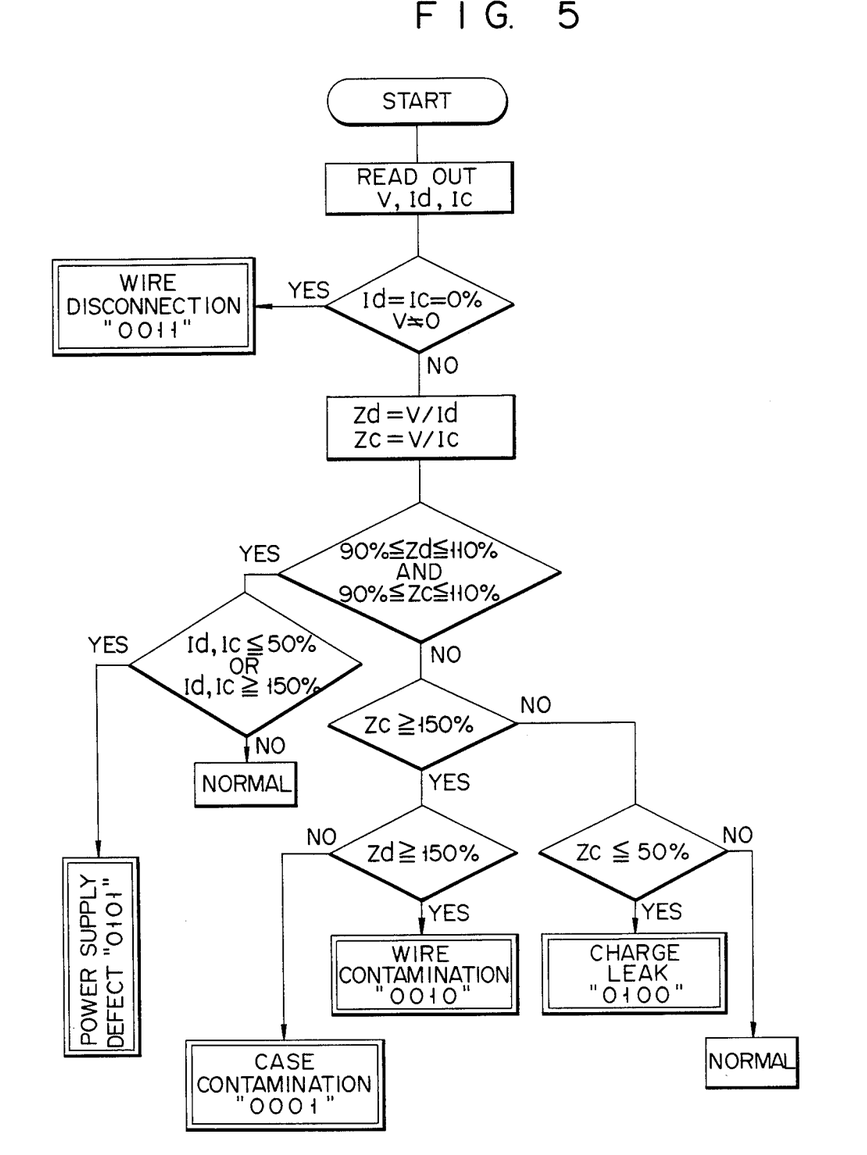
FIGS. 5 and 6 are flow charts showing the operation of the charger abnormality detecting device of the present invention.

When the wire W of any of the chargers 12, 15, 16 and 17 is contaminated, both the impedances Zd and Zc of the corresponding charger change. Accordingly, when Zd≧150% and Zc≧150%, the microprocessor 41 determines that the wire W has been contaminated. The microprocessor 41 then produces an abnormality signal "0010" to the display panel 11 to display the occurrence of the abnormality and the type thereof. When the wire W is disconnected, neither of the currents Id and Ic flows. Thus, when Id=Ic=0 (where V=0), the microprocessor 41 determines that the wire W has been disconnected. In this case, the microprocessor 41 supplies a corresponding abnormality signal "0011" to the display panel 51 to display the occurrence of a wire disconnection. When charge leak has occurred at one of the chargers 12, 15, 16 and 17, only the impedance Zc decreases. Accordingly, when Zd=100% and Zc≦50%, the microprocessor 41 determines that a charge leak has occurred and supplies an abnormality signal "0010" to the display panel 51 so as to display the occurrence of the abnormality and its type. When one of the high voltage sources $31_1$ to $31_4$ is defective, the impedances Zd and Zc remain normal. However, the currents and voltage fluctuate. Accordingly, when Zd=Zc=100%; and either Id and Ic≦50% and V≦50% or Id and Ic≧150% and V≧150%, the microprocessor 41 determines that one high voltage source is defective and supplies an abnormality signal "0101" to the display panel 51 so as to display the occurrence of the abnormality and its type. FIG. 5 is a flow chart showing the sequence of operation as described above. In this flow chart, discrimination under the conditions of Zd=Zc=100% is performed within the ranges of 90%≦Zd≦110% and 90%≦Zc≦110%, in consideration of fluctuations due to environmental factors.

Table 2 and the flow chart in FIG. 6 below show the abnormality discrimination criteria and the abnormality detection flow chart, respectively, when the output voltage V from the high voltage source is a DC voltage.

TABLE 2

| Impedance Zc | Current Ic | Voltage V | Abnormality signal | Type of abnormality |
|---|---|---|---|---|
| 150% or more | — | — | 0001 | Case or wire contamination |
| ∞ | 0% | — | 0010 | wire disconnection |
| 50% or less | — | — | 0011 | Charge leak |

Figure 6:
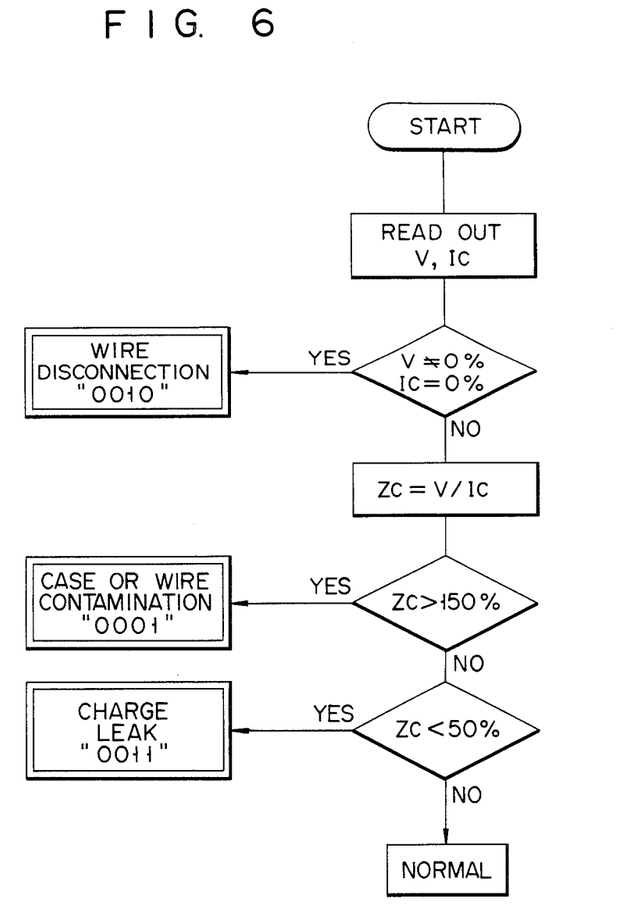

The abnormality discrimination criteria shown in Tables 1 and 2 are programmed in the microprocessor 41 as shown in the flow charts in FIGS. 5 and 6. Accordingly, abnormalities of the high voltage sources $31_1$ to $31_4$ and the chargers 12, 15, 16 and 17 can be detected in accordance with the output signals (V, Id, Ic) from the voltage detectors $34_1$ to $34_4$ and the current detectors $32_1$ to $32_4$ and $33_1$ to $33_4$. Whether the outputs from the high voltage sources are AC or DC voltages can be preset in the microprocessor 41. Then, in actual abnormality detection, the criteria in Tables 1 and 2 are selectively used for detection in accordance with the output signals V, Id and Ic from the high voltage sources. The type of abnormality which can be detected and the abnormality discrimination criteria can be freely modified by modifying the program stored in the microprocessor 41, thereby allowing modification in accordance with different specifications of various electrographic apparatuses.

In the above embodiment, the impedances Zd and Zc are calculated in accordance with the output V from the high voltage source, the current Id flowing between the charge wire W and the photoconductive drum 11, and the current Ic flowing between the charge wire W and the shield case S. For this reason, the present invention is not limited to high voltage sources of constant current control type but may be similarly applied to high voltage sources of constant voltage control type. This latter case may be achieved by a modification of the abnormality discrimination criteria and the program stored in the microprocessor 41. Table 3 below shows an example of abnormality discrimination criteria in the case wherein output voltages V from high voltage sources are AC voltages. Abnormality detection is performed in accordance with the abnormality discrimination criteria shown.

TABLE 3

| Voltage V | Current Id | Current Ic | Abnormality signal | Type of abnormality |
|---|---|---|---|---|
| 100% | 100% | 50% or less | 0001 | Case contamination |
| 100% | 50% or less | 50% or less | 0010 | Wire contamination |
| 100% | 0% | 0% | 0011 | Wire disconnection |
| 100% | 100% | 200% or or more | 0100 | Charge leak |
| 50% or less | 50% or less | 50% or less | 0101 | Defective high voltage source |

For example, when the shield case S is contaminated, the impedance Zc alone is increased, the current Ic decreases, and the output voltages V and the current Id remain normal. Accordingly, when V=100%, Id=100%, and Ic=50% or less (when its value in the normal state is defined as 100%), the microprocessor 41 determines that the shield case S has been contaminated and displays the occurrence of shield case contamination at the display panel 51. When the wire W is contaminated, both the impedances Zd and Zc increases. For this reason, the currents Id and Ic both decrease and the output voltages V alone remain unchanged. Accordingly, when V=100%, Id=50% or less and Ic=50% or less, the microprocessor 41 determines that the wire W has been contaminated and displays the occurrence of wire contamination at the display panel 51. When the wire W is disconnected, neither of the currents Id and Ic flows. According, when V=100% and Id=Ic=0%, the microprocessor 41 determines that the wire W has been disconnected and displays the occurrence of wire disconnection at the display panel 51. When charge leak occurs, the impedance Zc alone decreases and the current Ic increases. Thus, when V=100%, Id=100% and I=200% or more, the microprocessor 41 determines that charge leak has occurred and displays the occurrence thereof at the display panel 51. When one of the high voltage sources is defective, the corresponding output voltage V decreases, and the impedance Zd and Zc remain unchanged. Thus, the currents Id and Ic both decrease. When V=50% or less, Id=50% or less, and Ic=50% or less, the microprocessor 41 determines that a defective high voltage source is present and displays the fact at the display panel 51. When the output voltage V from the high voltage source is a DC voltage, abnormality detection can be performed in accordance with the abnormality discrimination criteria shown in Table 4 below.

TABLE 4

| Voltage V | Current I | Abnormality signal | Type of abnormality |
|---|---|---|---|
| 100% | 50% or less | 0001 | Case or wire contamination |
| 100% | 0% | 0010 | Wire disconnection |
| 100% or less | 200% or more | 0011 | Charge leak |
| 50% or less | 50% or less | 0100 | Defective high voltage source |

The abnormality discrimination criteria in Tables 3 and 4 are stored in the microprocessor 41. Then, abnormalities of the high voltage sources $31_1$ to $31_4$ and the chargers 12, 15, 16 and 17 can be detected in accordance with the output signals (V, Id and Ic) from the voltage detectors $34_1$ to $34_4$ and the current detectors $32_1$ to $32_4$ and $34_1$ to $34_4$. Tables 3 and 4 are selectively used as in the embodiment described above.

With the detecting device of the configuration as described above, the detection of defective high voltage sources, charge wire contamination or disconnection, or case contamination, which has conventionally required either manual determination from the copied image by maintenance personnel or high-voltage voltmeters, can be simply and reliably performed. The device of the present invention can then warn the user or maintenance personnel of the occurrence and type of abnormality. The device of the present invention eliminates the necessity and time taken for checking by maintenance personnel, and can also warn the user of when it is fine for cleaning the charge wire and the case. The maintenance cost of calling out maintenance personnel can thus be reduced.

The above embodiment has been described with reference to a charger of an electrophotographic apparatus. However, the present invention is not limited to this, and various changes and modifications may be made within the spirit and scope of the present invention.

In summary, a charger abnormality detecting device of the present invention can reliably detect abnormalities such as a defective high voltage source, charge wire contamination, charge wire disconnection and the like and can provide warning of such abnormalities to the user.

What is claimed is:

1. In a photocopying device of the type having a charging system including charging means for charging the surface of a photoconductive drum and/or a sheet of paper, said charging means including a shield case and a charge wire, and a source of high voltage coupled to said charge wire, an apparatus for detecting abnormal operation of said charging system comprising:
   first current detecting means for producing a first current signal indicating the level of current Ic flowing from said charge wire to said shield case;
   voltage level detecting means for producing a first voltage signal indicating the voltage level produced by said high voltage source;
   processing means, connected to receive said first current signal and said first voltage signal, for determining abnormal operation of said charging system, in response to the levels of said first current signal and said first voltage signal; and
   second current detecting means for producing a second current signal indicating the level of current Id flowing from said charge wire to said photoconductive drum;
   said processing means calculating an impedance Zd of a series circuit formed by the charge wire and the photoconductive drum, in response to said second current signal and said first voltage signal; and calculating an impedance Zc of a series circuit formed by the charge wire and the shield case, in response to said first current signal and said first voltage signal, determining that the shield case is contaminated when said calculated impedance Zd is approximately equal to a first nominal value and the calculated impedance Zc is substantially greater than a second nominal value, determining that the charge wire is contaminated when the calculated impedance Zd is substantially greater than the first nominal value and said calculated impedance Zc is substantially greater than the nominal value, and determining that charge is leaking from said wire if said calculated impedance Zc is substantially less than the second nominal value.

2. An apparatus as in claim 1 wherein said processing means determines if any one of the following conditions exists:
   (a) said charge wire is contaminated, (b) said shield case is contaminated, (c) said charge wire is disconnected from said high voltage source, and (d) said high voltage source is defective.

3. An apparatus as in claim 1 wherein said processing means is provided for:
   comparing said first and second current signals with respective nominal ranges of levels;
   comparing said first voltage signal with a nominal voltage range; and
   determining said high voltage source has malfunctioned if said first and second current signals are both outside of said respective nominal ranges and said first voltage signal is also outside of said nominal voltage range.

4. An apparatus as in claim 1 wherein said processing means is provided for compensating said first and second current signals and said first voltage signal for changes in at least one of ambient temperature, ambient humidity and ambient air pressure.

5. In a photocopying device of the type having a charging system including charging means for charging the surface of a photoconductive drum and/or a sheet of paper, said charging means including a shield case and a charge wire, and a source of high voltage coupled to said charge wire, an apparatus for detecting abnormal operation of said charging system comprising:
   first current detecting means for producing a first current signal indicating the level of current $I_c$ flowing from said charge wire to said shield case;
   voltage level detecting means for producing a first voltage signal indicating the voltage level produced by said high voltage source; and
   processing means, connected to receive said first current signal and said first voltage signal, for determining abnormal operation of said charging system in response to the levels of said first current signal and said first voltage signal, said processing means also being provided for:
   calculating the impedance $Z_c$ of the circuit formed by the charge wire and the shield case in response to said first current signal and said first voltage signal;
   determining the shield case and/or the charge wire is contaminated when said calculated impedance $Z_c$ exceeds a first predetermined level;
   determining charge is leaking from said charge wire when said calculated impedance $Z_c$ is less than a second predetermined level less than said first level; and
   determining said charge wire is disconnected from said high voltage source when said first current signal indicates the level of said current $I_c$ is equal to zero.

6. In a photocopying device of the type having a charging system including charging means for charging the surface of a photoconductive drum and/or a sheet of paper, said charging means including a shield case and a charge wire, and a source of high voltage coupled to said charge wire, an apparatus for detecting abnormal operation of said charging system comprising: first current detecting means for producing a first current signal indicating the level of current Ic flowing from said charge wire to said shield case;

voltage level detecting means for producing a first voltage signal indicating the voltage level produced by said high voltage source;

processing means, connected to receive said first current signal and said first voltage signal, for determining abnormal operation of said charging system, in response to the levels of said first current signal and said first voltage signal; and second current detecting means for producing a second current signal indicating the level of current Id flowing from said charge wire to said photoconductive drum;

said processing means determining that the high voltage source has failed if the level of said first voltage signal is less than a first predetermined voltage level, determining that said shield case is contaminated if the level of said first current signal is substantially less than a first predetermined nominal current level and the level of said second current signal is substantially equal to a second predetermined nominal current level, determining that said charge wire is contaminated if said second current signal is substantially less than said second current level and the level of said first current signal is substantially less than said first current level, determining that said charge wire is disconnected from said high voltage source if said first and second current signals are both equal to zero, and determining that charge is leaking from said charge wire if the level of said first current signal substantially exceeds said first current level.

7. In a photocopying device of the type having a charging system including charging means for charging the surface of a photoconductive drum and/or a sheet of paper, said charging means including a shield case and a charge wire, and a source of high voltage electrically coupled to said charge wire, a method of detecting abnormal operation of said charging system comprising the steps of:

(1) detecting the current $I_c$ flowing from said charge wire to said shield case;

(2) detecting the voltage level produced by said high voltage source;

(3) determining abnormal operation of said charging system in response to the current $I_c$ detected by said detecting step (1) and the voltage level detected by said detecting step (2);

(4) calculating impedance $Z_c$ of the series circuit formed by the charge wire and the shield case in response to said current $I_c$ detected by said detecting step (1) and the voltage level detected by said detecting step (2);

(5) determining the shield case and/or the charge wire is contaminated when said impedance $Z_c$ calculated by said calculating step (4) exceeds a first predetermined level;

(6) determining charge is leaking from said charge wire when said calculated impedance $Z_c$ is less than a second predetermined level less than said first level; and (7) determining said charge wire is disconnected from said high voltage source when said current $I_c$ detected by said detecting step (1) is equal to zero.

8. In a photocopying device of the type having a charging system including charging means for charging the surface of a photoconductive drum and/or a sheet of paper, said charging means including a shield case and a charge wire, and a source of high voltage electrically coupled to said charge wire, a method of detecting abnormal operation of said charging system comprising the steps of:

(1) detecting current $I_c$ flowing from said charge wire to said shield case;

(2) detecting the voltage level produced by said high voltage source;

(3) determining abnormal operation of said charging system in response to the current $I_c$ detected by said detecting step (1) and the voltage level detected by said detecting step (2); and (4) detecting current $I_d$ flowing from said charge wire to said photoconductive drum;

said determining step (3) determining abnormal operation of said charging system also in response to said current $I_d$ detected by said detecting step (4).

9. A method as in claim 8 wherein said determining step (3) includes the step of automatically determining if any one of the following conditions exists: (a) said charge wire is contaminated, (b) said shield case is contaminated, (c) said charge wire is disconnected from said high voltage source, and (d) said high voltage source is defective.

* * * * *